United States Patent

Arnold

[11] Patent Number: 5,918,966
[45] Date of Patent: Jul. 6, 1999

[54] LIGHT WITH COLORED SILICONE CAP

[75] Inventor: Werner Arnold, Bamberg, Germany

[73] Assignee: W. Albrecht GmbH & Co. KG, Bamberg, Germany

[21] Appl. No.: 08/609,072

[22] Filed: Feb. 29, 1996

[30] Foreign Application Priority Data

Mar. 3, 1995 [DE] Germany ............... 195 07 518

[51] Int. Cl.[6] ................................................. F21M 7/00
[52] U.S. Cl. .................. 362/255; 362/226; 362/293; 256/696; 361/772
[58] Field of Search .................. 362/255, 293, 362/311, 457, 382, 226, 800; 361/772, 773, 774; 257/692, 693, 696

[56] References Cited

U.S. PATENT DOCUMENTS

| | | | |
|---|---|---|---|
| 2,615,096 | 10/1952 | Welch | 362/293 |
| 3,116,885 | 1/1964 | Morse | 362/255 |
| 3,162,721 | 12/1964 | Rayburn | 361/773 |
| 3,312,814 | 4/1967 | Reading | 362/255 |
| 3,473,015 | 10/1969 | Haas et al. | 362/293 |
| 5,068,771 | 11/1991 | Savage, Jr. | 362/255 |
| 5,115,379 | 5/1992 | Nagai | 362/293 |
| 5,143,443 | 9/1992 | Madsen | 362/255 |
| 5,165,789 | 11/1992 | Womack | 362/255 |
| 5,221,140 | 6/1993 | Oshino | 362/293 |
| 5,440,468 | 8/1995 | Savage, Jr. | 362/311 |
| 5,452,190 | 9/1995 | Priesemuth | 362/255 |
| 5,463,502 | 10/1995 | Savage, Jr. | 362/255 |
| 5,539,628 | 7/1996 | Seib | 362/293 |
| 5,593,223 | 1/1997 | Koizumi | 362/255 |

FOREIGN PATENT DOCUMENTS

88/03327  5/1988  WIPO ................... 362/293

Primary Examiner—Stephen Husar
Attorney, Agent, or Firm—Jordan and Hamburg LLP

[57] ABSTRACT

A light with a rubber-elastic cap, especially a colored silicone cap, particularly for attachment to printed circuit boards by soldering in the connecting wires of the light emerging from the bottom of the glass bulb, the silicone cap being provided with an edge thickening, which covers the lower section of the glass bulb and protrudes downward beyond the bottom of the glass bulb as installation edge, and the light connection wires being inclined and/or bent downward in such a manner that, after insertion in the boreholes of the printed circuit board, they brace the installation edge against the printed circuit board.

7 Claims, 1 Drawing Sheet

LIGHT WITH COLORED SILICONE CAP

BACKGROUND OF THE INVENTION

The invention relates to a light with a rubber-elastic cap, especially a colored silicone cap, particularly for attachment to printed circuit boards by soldering in the connecting wires of the light emerging from the bottom of the glass bulb.

In order to achieve multi-colored displays, for example, on dashboards or similar display panels, colorless lights, for example, are used, which are changed in an appropriate manner by colored silicone caps, which are pulled onto the lights.

For the usual attachment of such lights by inserting the connecting wires of the light, protruding from the bottom of the glass bulb, into appropriate boreholes of the printed circuit boards and subsequently soldering them by wave soldering, the danger arises that the lights in the wave soldering bath will be tilted by the soldering process so that, after the soldering, they are seated at an angle in the printed circuit board. For many applications, this is disadvantageous from the point of view of illumination or for installation reasons and it is therefore necessary to align the lights manually. Aside from the appreciable costs, which arise for this, the danger exists that the soldered connection of the light is damaged, and air may enter the light bulb, which in the final analysis leads to a failure of the light.

In order to eliminate these difficulties, it has already been proposed to fit, to begin with, a plastic sleeve, which acts as a butt-ended sleeve when the light is placed on the printed circuit board, on the lower region of the light. In the case of colored lights, the actually colored silicone cap is then pulled over the glass bulb and the plastic sleeve surrounding the lower portion of the glass bulb. However, this is also once again extremely tedious. Not only does it require the additional step of fitting a plastic cap; in addition, the subsequent pulling on of the plastic cap is also made more difficult, since this cap must not only surround the small light tightly and therefore is limited in size, but must also still be pulled over the thicker plastic cap.

SUMMARY OF THE INVENTION

It is therefore an object of the invention to configure a light of the initially described type so that it is easy to construct and to install, yet is prevented from tilting while being fastened and particularly while being soldered to printed circuit boards.

Pursuant to the invention, this objective is accomplished by providing the cap with an edge thickening, which covers the lower section of the glass bulb and protrudes downward over the bottom of the glass bulb as an installation edge. Preferably, the cap additionally has in the region of the installation edge an inwardly pointing edge shoulder, which fixes the lamp in the cap (in the following, for the sake of simplicity, reference is always made to the preferred silicone cap) and takes hold of the glass bulb from below. Furthermore, pursuant to the invention, the wires connecting the light are inclined and/or bent downward in such a manner that, after they are inserted in the boreholes of the printed circuit board, they brace the installation edge against the printed circuit board.

It has namely been observed that a thickening of the silicone cap, which actually represents a very flexible material, results in a sufficiently stable installation edge, which is fully adequate for the purposes addressed of preventing any tilting of the light while it is being fastened to the printed circuit board. It therefore does not matter at all that one has an installation edge in the form of an additionally mounted plastic cap or even that the small light initially is fastened to a plastic socket. An edge thickening of the flexible silicone cap is adequate for the inventive prevention of tilting. In this connection, it merely matters that the edge thickening does not start only below the small light and, instead, extends partially over the lower section of the glass bulb, in order to achieve stabilization of the flexible edge thickening in this manner.

The second distinguishing feature of the invention is of importance for the preliminary fixing of the small light before the soldering of its connecting wires. According to this second distinguishing feature, the resilient connecting wires of the light are inclined and/or bent downwards in such a manner that, after they are inserted in the boreholes of the printed circuit board, they brace the installation edge against printed circuit board in that an inclined section of the light connection wires lie against the lower edge of the insertion borehole and, with that, bring about this bracing. At the same time, there is also compensation of the tolerances of the printed circuit board due to the elasticity of the cap, freely protruding downward over the glass bulb.

The invention will be explained in greater detail below with the help of an example and by means of the accompanying drawings

DESCRIPTION OF THE PREFERRED EMBODIMENTS

Figure 1:
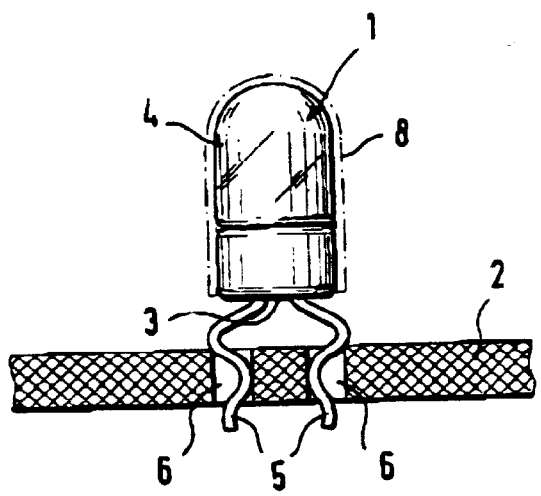
FIGS. 1 and 2 show examples of conventional commercial lights with colored silicone caps.

FIG. 1 shows a conventional embodiment of a small light 1 for installation in a printed circuit board 2, the lamp connection wires 5, passing through the bottom 3 of the glass bulb 4 of the small bulb 1, being inserted in appropriate boreholes 6 of the printed circuit board, in which, after all the lights and other components have been mounted, they are fastened by wave soldering so as to make electrical contact. Due to the fact that the distances between the boreholes 6 usually are larger than the distances between light connection wires 5 as they emerge from the bottom 3, the need necessarily arises to position the little light 1 above the printed circuit connection board 2 in such a manner, that there is a space between the bottom and the printed circuit board 2. The little light therefore cannot be seated directly on the printed circuit board. As a result, the little light can tilt before or during the soldering and is then no longer aligned precisely after the soldering.

Figure 2:
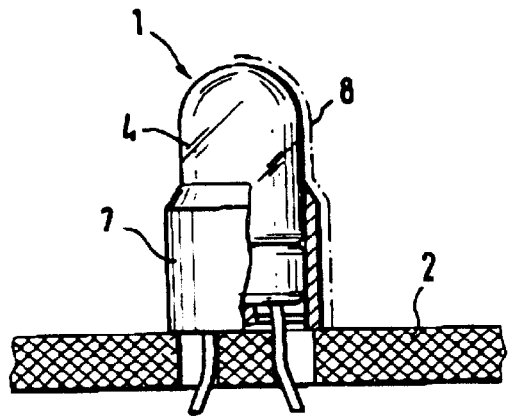

In order to avoid this, it has already been proposed that a plastic sleeve 7, which protrudes downwards beyond the installation sleeve, be fitted on the small light 1 (see FIG. 2). In the event that colored small lights were necessary, a colored silicone cap 8 was then pulled over the glass bulb 4 and the plastic sleeve 7. A conventional, commercial form of such a silicone cap 8 for a colored light is also indicated in FIG. 1. For the arrangement of FIG. 2, this fitting of a colored silicone cap is made difficult by the plastic socket 7, which requires a correspondingly greater expansion of the flexible silicone material, so that it can also be fitted over the plastic sleeve 7.

Figure 3:
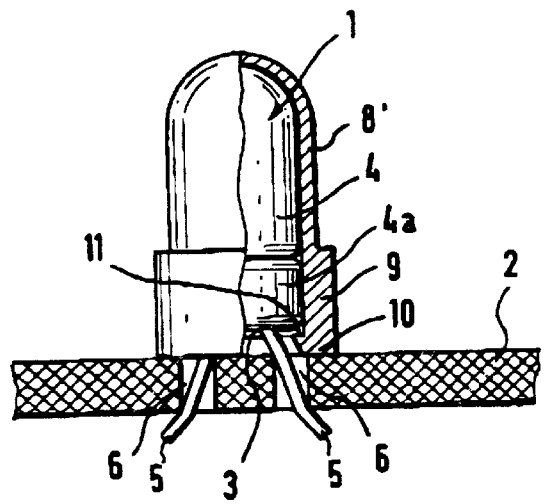
FIG. 3 is a partial sectional side view of a small light with an inventive, colored silicone cap with installation edge.

In the case of the inventive construction of FIG. 3, a colored silicone cap 8' is fitted on the small light 1. The silicone cap 8' is provided with an edge thickening 9, which, on the one hand, overlaps the lower region 4a of the glass bulb 4 and, on the other, protrudes downward beyond the bottom 3 of the glass bulb as an installation edge 10 for putting the small light 1 upright on the printed circuit board 2.

The production of such colored silicone caps with an edge thickening 9 is hardly more complicated than the manufacture of the simple, previously used silicone caps 8. However, the construction is simpler and, in particular, the installation is appreciably easier than in the case of the previous tilt-proof arrangement of FIG. 2.

Constructing the edge thickening 9 with a wall thickness, which is greater than the conventional wall thickness of plastic sleeves 7, as used in FIG. 2, compensates for the fact that silicone is appreciably more flexible than plastic. On the other hand, the invention utilizes the fact that the butt-end cap need not be absolutely rigid. Instead, it is merely necessary that the preliminary fixing prevents tilting until the ultimate holding of the light is achieved by soldering the connection wires 5.

It can be seen in FIG. 3 that the thickening 9 in the region of the installation edge 10 also extends inward with the formation of an edge shoulder 11, which takes hold of the bottom 3 of the glass bulb 4 from below. Moreover, it can be seen in this Figure that the inclination of the light connection wires 5 towards one another as well as a bending of the light connection wires which, in coordination with the distance between the insertion opening 6 of course, are selected so that the resilient lamp connection wires 5 lie in the indicated manner against the lower edge of the insertion openings 6 and, in this manner, pull the small light against the upper side of the printed circuit board 2, and with that, bring about a preliminary fixing with bracing of the installation foot 10 against the printed circuit board 2, so that the small light will not fall out or even only lose its vertical orientation with respect with the printed circuit board 2, even if the latter is turned upside down.

I claim:

1. A light bulb adapted to be mounted adjacent to an opening in a circuit board comprising a glass light bulb, said light bulb having a lower portion, said lower portion having a bottom, connecting wires extending from said bottom, a resilient cap disposed about said light bulb, said cap having an upper section and a lower section, said lower section being disposed about said lower portion of said light bulb, said lower section being thicker than said upper section, said lower section having a bottom in contact with said circuit board, said connecting wires passing through said opening and having emerging portions emerging from said opening in a diverging and non-parallel relationship such that said emerging portions are displaced from having a superimposed relationship with the opening, said connecting wires resilient engaging said opening to resiliently retain said light bulb on said circuit board, said lower section of said cap having an inner cylindrical wall which receives said lower portion of said light bulb, said lower section of said cap having protrusions extending radially inwardly of said inner cylindrical wall, whereby the light bulb is thereby supported in the resilient cap by the engagement of said bottom of said light bulb with said protrusions.

2. A light bulb according to claim 1 wherein said upper and lower sections of said resilient cap are integral with one another.

3. A light bulb according to claim 1 wherein said lower portion of said light bulb has a generally cylindrical configuration having an outer diameter, said lower section of said cap having an upper cylindrical part having an inner diameter substantially equal to the outer diameter of said lower portion of said light bulb, said lower section of said cap having a lower part from which such protrusions extend radially inwardly such that such protrusions have an inner radial end disposed along a circle having a diameter less than the outer diameter of said lower portion of said light bulb.

4. A light bulb according to claim 1 wherein said light bulb has an intermediate cylindrical portion integral with said lower portion, said light bulb having an upper hemispherical portion integral with said intermediate cylindrical portion, said upper section of said cap being disposed about said upper hemispherical portion of said light bulb and about said intermediate cylindrical portion of said light bulb.

5. A light bulb according to claim 4 wherein said upper section of said cap comprises a hemispherical part disposed about said hemispherical portion of said light bulb and a cylindrical part disposed about said intermediate cylindrical portion of said light bulb.

6. A light bulb according to claim 1 wherein said cap is a colored silicone cap.

7. A light bulb adapted to be mounted adjacent to an opening in a circuit board comprising a glass light bulb, said light bulb having a lower portion, said lower portion having a bottom, connecting wires extending from said bottom, a resilient cap disposed about said light bulb, said cap having an upper section and a lower section, said lower section being thicker than said upper section, said lower section having a bottom in contact with said circuit board, each of said connecting wires including a diverging section disposed in a diverging and non-parallel relationship, said diverging section having a first diverging subsection and a second diverging subsection, said first-diverging subsection emerging from said opening and being displaced from having a superimposed relationship with said opening, said second diverging subsection resilient engaging said opening to resiliently retain said light bulb on said circuit board.

* * * * *